United States Patent [19]

Rowe

[11] Patent Number: 4,472,677

[45] Date of Patent: Sep. 18, 1984

[54] TEST BOX APPARATUS FOR TESTING ADAPTER BOXES AND CIRCUIT CARD ASSEMBLIES

[76] Inventor: Richard E. Rowe, 10648 Gascoigne Dr., Cupertino, Calif. 95014

[21] Appl. No.: 287,403

[22] Filed: Jul. 27, 1981

[51] Int. Cl.³ .................... G01R 15/12; G01R 31/02
[52] U.S. Cl. ............................. 324/73 R; 324/158 F
[58] Field of Search .......... 324/73 R, 73 AT, 73 PC, 324/158 F

[56] References Cited

U.S. PATENT DOCUMENTS 3,760,261  9/1973  Collins .............................. 324/73 R Primary Examiner—Gerard R. Strecker
Assistant Examiner—Walter E. Snow
Attorney, Agent, or Firm—Donald J. Singer; William Stephanishen

[57] ABSTRACT

A test box apparatus utilizing a plurality of test point jacks to provide access for monitoring points within the circuit of the unit or card under test. The test box apparatus also utilizing a plurality of switching circuits which are arranged to provide a variety of signals that may be connected into various points in the unit or card under test and thereby isolate malfunctions within the test unit.

8 Claims, 5 Drawing Figures

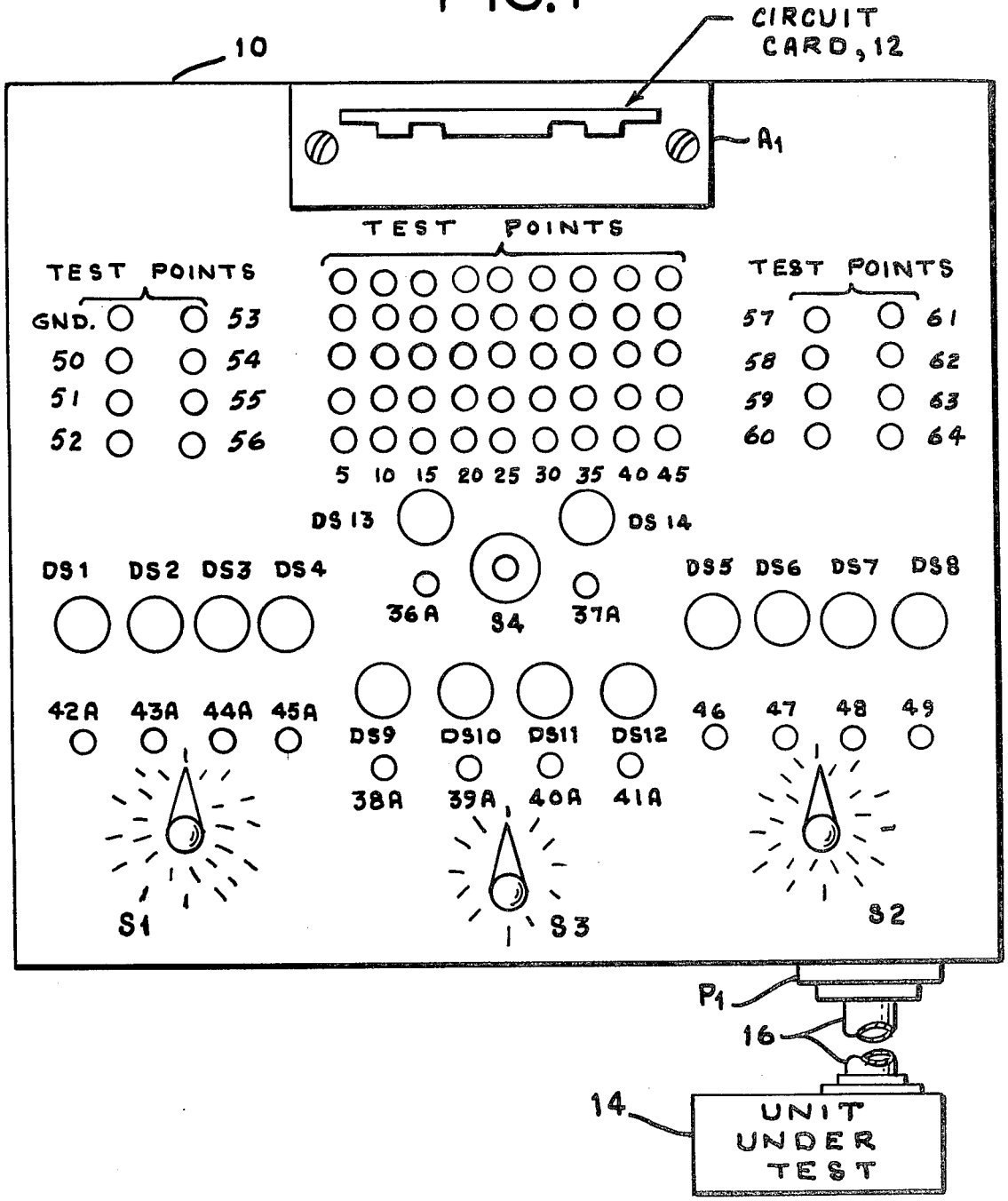

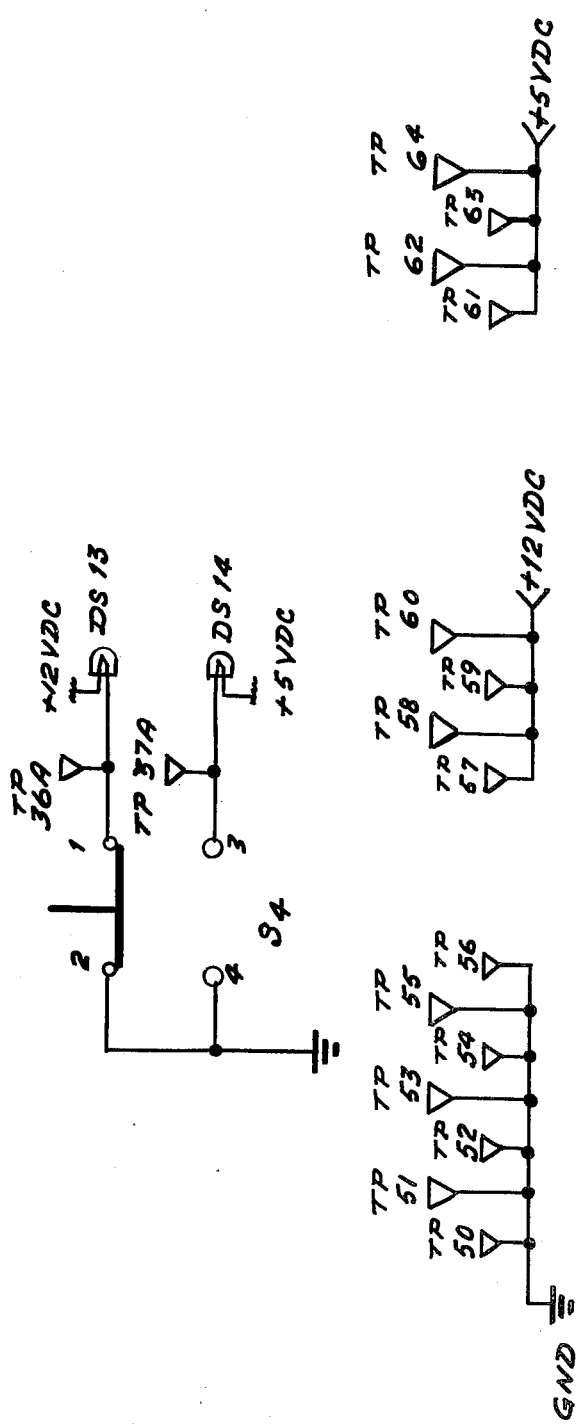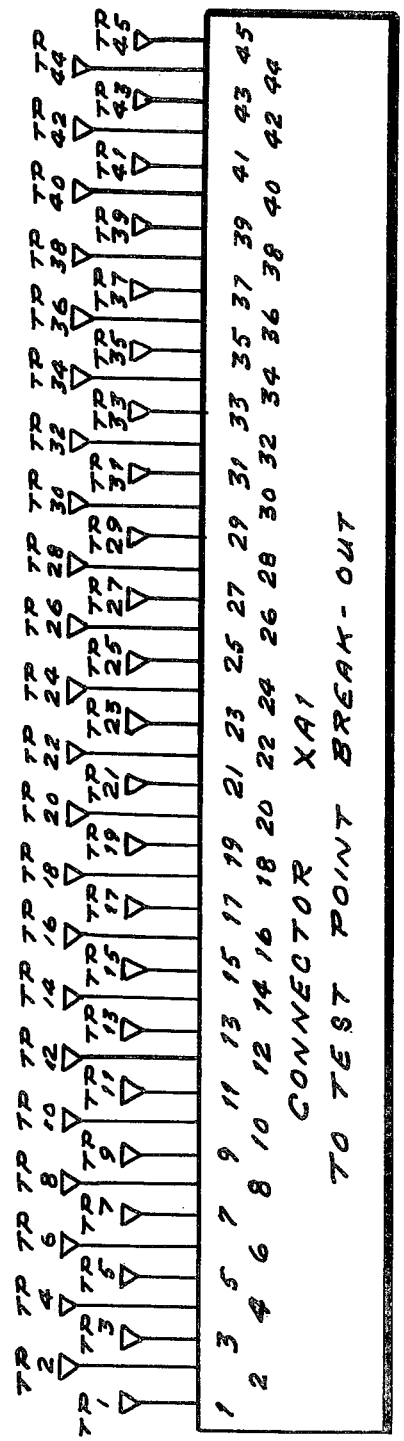
FIG.2a

FIG. 2d
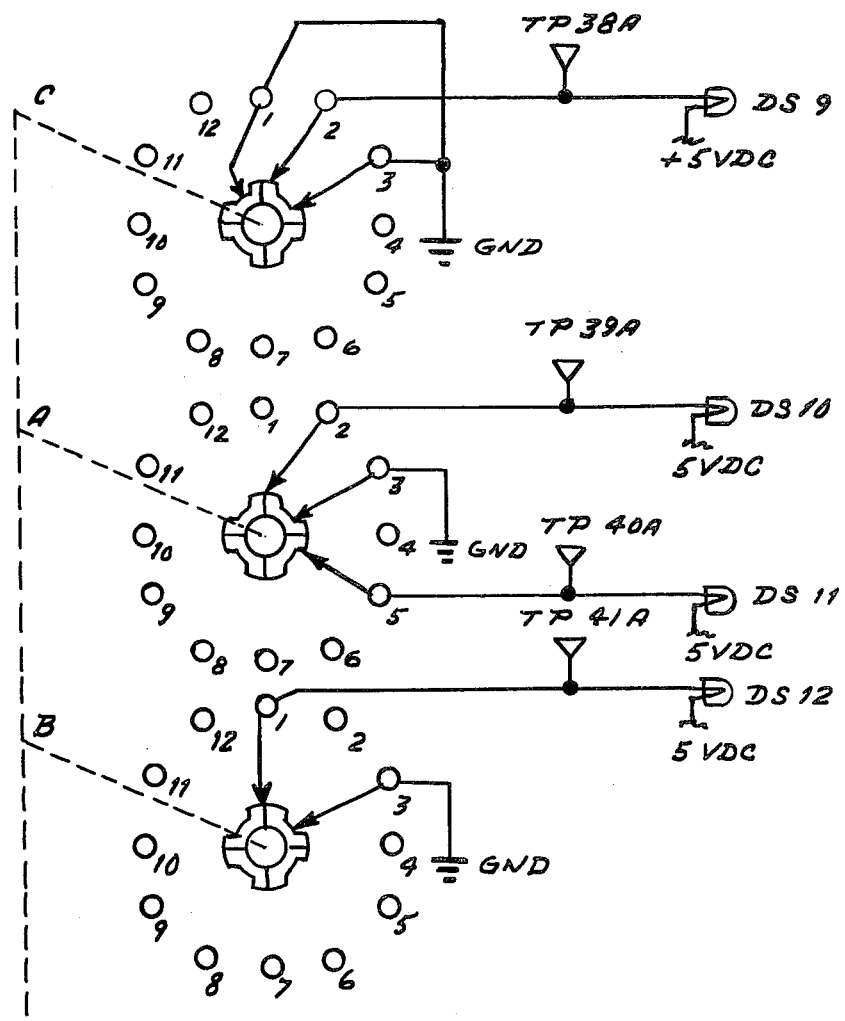
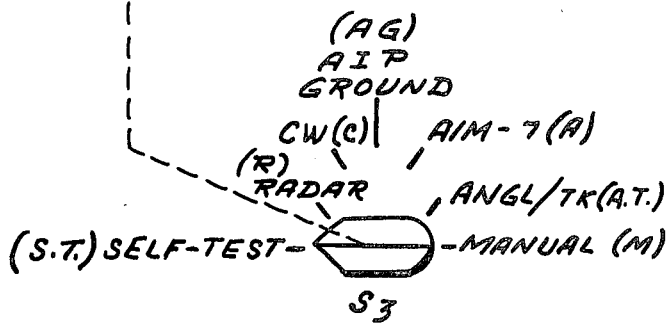

TEST BOX APPARATUS FOR TESTING ADAPTER BOXES AND CIRCUIT CARD ASSEMBLIES

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a test set apparatus, and in particular to a missile/simulator adapter and circuit card tester apparatus.

In the prior art, the testing of electrical units and circuit cards were limited to testing the components of these elements prior to installation in the electrical unit or circuit card. In addition, the electrical wiring in the electrical units and on the circuit cards could be checked only by having the electrical equipment disconnected from the power source. An ohm meter is then used to measure the continuity from one end of the conductor to the other end and also to make sure that there is no continuity between either end of the conductor and any other conductor in the unit or card and the cable or harness. A continuity check is made from both ends of the conductor under test to the cable end plugs and chassis ground. Thus, it may be clearly seen that prior art methods of making the above electrical checks require a tedious and time consuming manual procedure which is subject to human error. Certain prior art automatic or semiautomatic equipment has been devised to perform these functions but for one reason or another, they have been found to be unsatisfactory. In addition, they are rather cumbersome, involve complex circuitry, have rather complex methods of operation and are difficult to calibrate and repair in the field.

SUMMARY OF THE INVENTION

The present invention utilizes a test box apparatus for testing a multi-missile/missile simulator adapter or circuit card assemblies. The test box apparatus supplies ground and DC signals to the unit under test by means of test point connections to various points within the test unit. The test box apparatus, by means of test point connections to either the cable supplying the test unit or the connector holding the circuit card assembly, provides access to various points within the test unit which may either be monitored for a desired signal or upon which a signal may be impressed. Thus, the test box apparatus may energize and/or deenergize circuit relays within the test unit to permit various signals to flow to specified test points for monitoring.

It is one object of the present invention, therefore, to provide an improved adapter/circuit card assembly test box apparatus.

It is another object of the invention to provide an improved adapter/circuit card assembly test box apparatus to provide test points to various points in the circuit under test.

It is yet another object of the invention to provide an improved adapter/circuit card assembly test box apparatus to supply ground and DC signals to the circuit under test.

It is still another object of the invention to provide an improved adapter/circuit card assembly test box apparatus which is economical to produce and utilizes conventional, currently available components that lend themselves to standard mass production manufacturing techniques.

These and other advantages, features and objects of the invention will become more apparent from the following description taken in connection with the illustrative embodiment in the accompanying drawings.

BRIEF DESCRIPTION OF THE DRAWINGS

FIG. 1 is a pictorial diagram of the test box apparatus for testing a multi-missile/missile simulator adapter and circuit card assemblies, FIG. 2a is a schematic diagram of the test box apparatus connector test points and voltage/ground test points, and FIG. 2b–2d are schematic diagrams of the ganged switch arrangements for providing specific voltages or grounds to designated test points.

DESCRIPTION OF THE PREFERRED EMBODIMENT

Figure 2B:
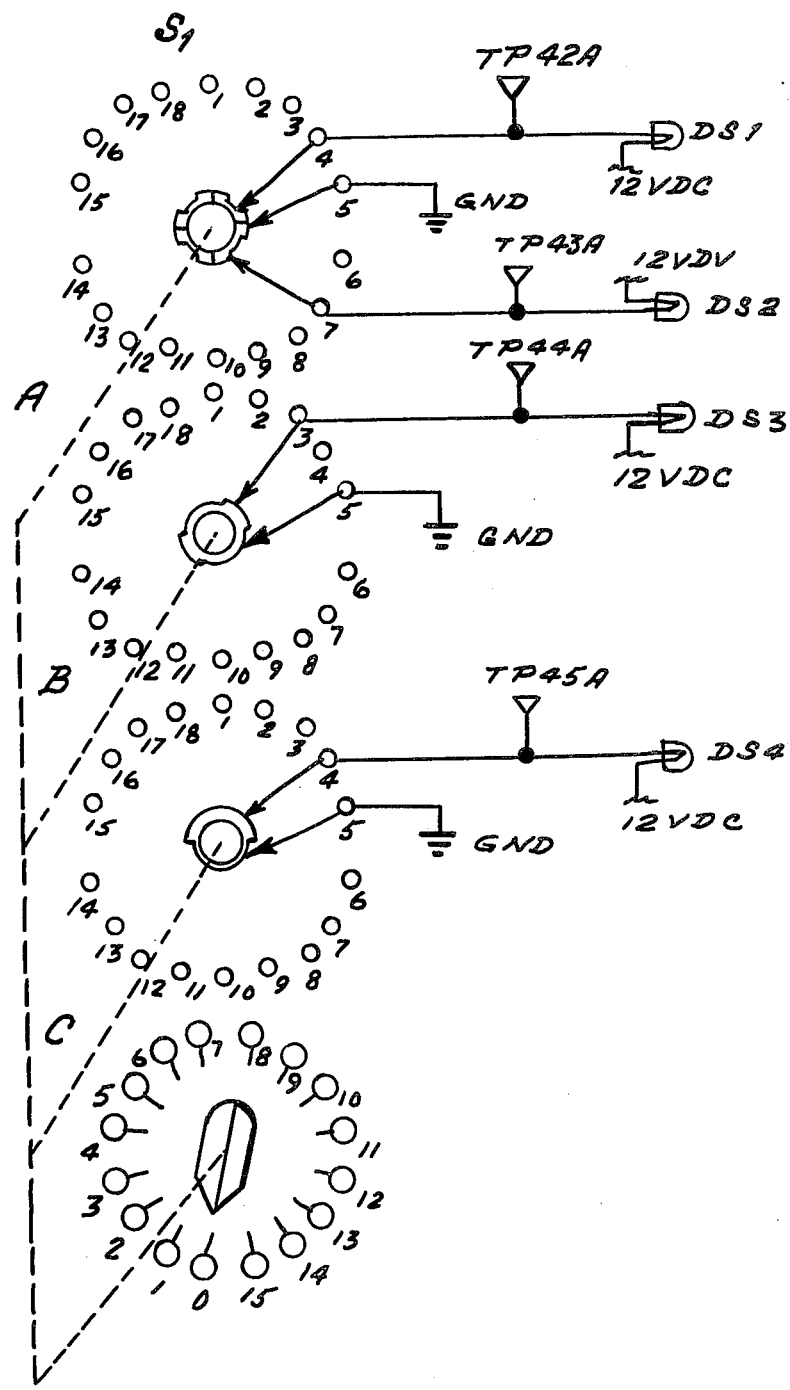

Referring now to FIG. 1, there is shown a test box apparatus for testing a multi-missile/missile simulator adapter or circuit card assemblies. The test box apparatus 10 utilizes printed circuit connector A1 to mount a printed circuit card assembly 12 to the test box. The printed circuit connector A1 contains a plurality of electrical contact pins which are respectively connected to the test point jacks that are shown on the test box apparatus 10. The test box apparatus 10 also contains a connector plug P1 to which a unit under test 14 may be connected by means of cable 16. In the present example, the unit under test 14 may comprise either a multi-missile adapter unit or a missile simulator adapter unit. The connector plug P1 contains a plurality of electrical contact pins which may be wired directly to the test point jacks 1 through 64 that are shown on the test box apparatus 10.

The test box apparatus 10 contains a plurality of test point jacks which are wired directly to ground, as well as a plurality of test point jacks which may be respectively connected directly to desired voltage supplies. The test point jacks which are wired directly to ground or some other voltage may be utilized to provide either ground or some other voltage by means of a jumper wire to a test point jack that is connected to either the printed circuit connector A1 or the connector plug P1. In this manner, a particular point or component in an electrical circuit or component in either the printed circuit card assembly 12 or the unit under test 14 may be energized or biased to a particular voltage potential.

The test box apparatus 10 also contains a plurality of switches S1–S3 which respectively operate in conjunction with a plurality of test point jacks and indicator lights. These switches S1–S3 are utilized to provide either a particular voltage to the test point jacks that are associated with a given switch or to provide a ground potential to the test point jacks associated therewith. The circuit arrangement for switches S1–S3 and their respective test point jacks and indicator lights will be discussed in greater detail with respect to FIGS. 2b–2d. There is also provided on the test box apparatus 10 a switch S4 which operates in conjunction with a pair of test point jacks and indicator lights. The operation of switch S4 will be discussed in greater detail when taken in conjunction with the illustrative embodiment given in FIG. 2a.

Turning now to FIG. 2a, there is shown a schematic diagram of printed circuit card connector A1. In the present example, the printed circuit card connector A1 is shown having a forty-five electrical contact pin arrangement. It will be well understood that either the particular number of electrical contact pins or the particular connector unit that is utilized may be varied with a given or desired unit test application. It may be seen from FIG. 2a that each electrical contact pin 1–45 in the printed circuit card connector A1 is directly connected to a corresponding test point jack, TP1–TP45. These test point jacks, TP1–TP45, enable a test operator to monitor a number of given points within the unit or circuit under test, as well as being able to apply desired voltages and signals to points within the circuit.

There is also shown in FIG. 2a, the wiring arrangement for the ground connections and a pair of DC voltages, +5 volts DC and +12 volts DC. While in the present example, these particular voltages have been chosen, it will be well understood that the polarity and magnitude of the voltages that are utilized may be varied as the test circuit and conditions dictate. In the given example, the ground point is directly connected to test point jacks, TP50 through TP56. A positive 12 volt DC supply source is directly connected to test point jacks, TP51 through TP60. Test point jacks, TP61 through TP 64 are connected directly to a positive 5 volt DC supply source. There is also shown in FIG. 2a the circuit arrangement for switch, S4. This switch, S4, is a push button switch with four electrical contacts, 1 through 4. Electrical contacts 2, 4 are connected directly to each other and to ground. Electrical contact 1 is connected directly to test point jack, TP36A and to one side of indicator light, DS13. The other side of indicator light, DS13 is connected directly to a positive 12 volt DC supply source. Electrical contact, 3 is connected directly to test point jack, TP37A and to one side of indicator light, DS14. The other side of indicator light DS14 is connected directly to a positive 5 volt supply source. It will be well understood again that while a particular voltage source has been utilized in the present example, that the polarity and magnitude of the supply voltages may be varied in relation to the test circuit and/or the test conditions or requirements. It will be noted that when push button switch, S4 is as shown, that test point jack, TP36A will be at ground potential and indicator light, DS13 will be illuminated. In this position of push button switch, S4, indicator light, DS14 is not illuminated and test point jack, TP37A is at potential of +5 volts D.C.

Figure 2C:
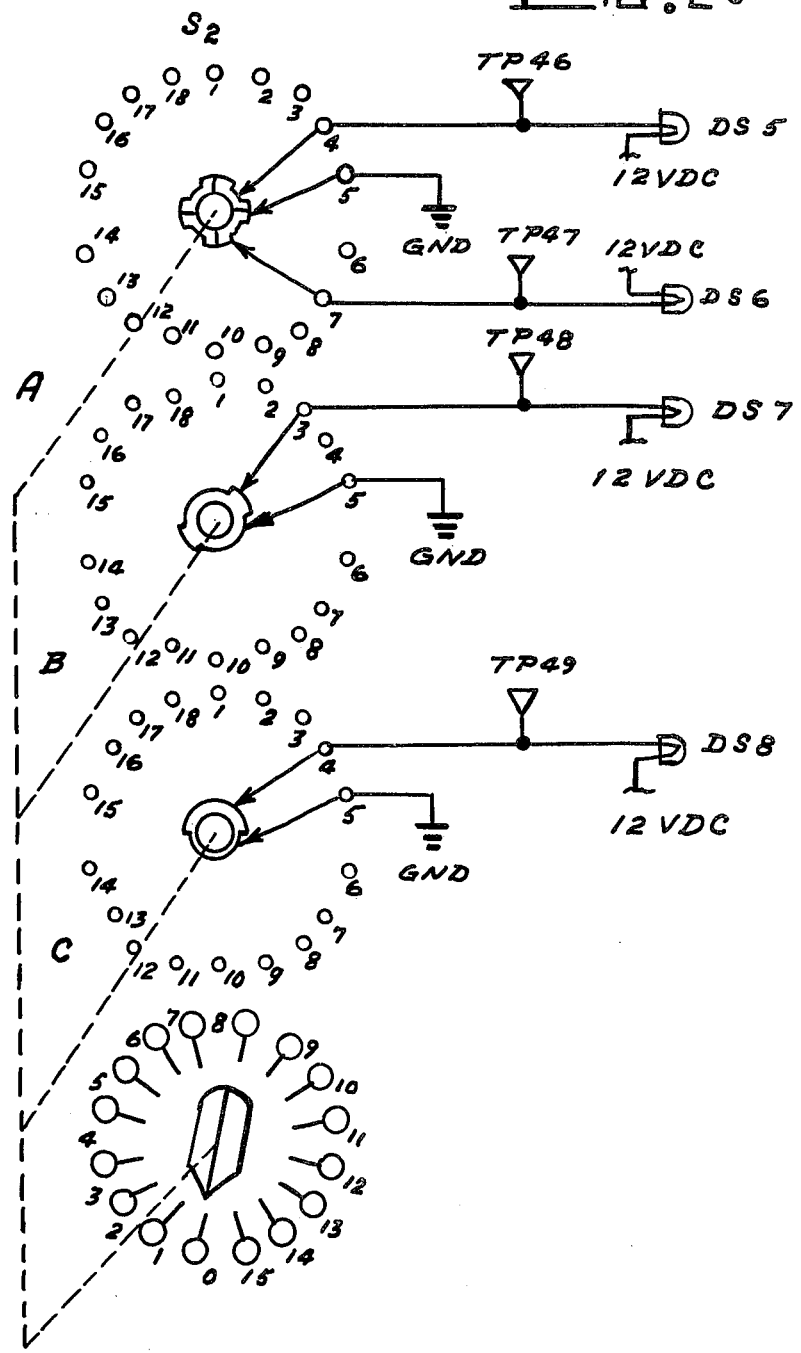

There is shown in FIGS. 2b, 2c a schematic diagram of the circuit configuration that is associated with both switch, S1 (shown in FIG. 2b) and switch S2 (shown in FIG. 2c). Since the circuit arrangements of switches S1 and S2 are substantially the same except for the character designations of the test point jacks and indication lights, the description with respect to these circuits will be accomplished with relation to both FIGS. 2b and 2c. Both switches S1 and S2 are multiposition, three wafer rotary switches. In both switching arrangements, electrical contact pin 5 on wafer A of both switches S1, S2 is connected to ground. Also, electrical contact pins 4 and 7 on wafer 14 of both switches S1, S2 are respectively connected to one side of an indicator light. These indicator lights are respectivly designated DS1, DS2, DS5 and DS6, and are connected to a positive 12 volt supply source. The circuit connection between pins 4 and 7 of both switches S1, S2 and the indicator lights, DS1, DS2, DS5, DS6 include respectively test point jacks TP42A, TP43A, TP46 and TP47. The switch contact segments are arranged such that when the switch position connects the ground on pin 5 to pin 7, the indicator light DS2,DS6 will illuminate respectively, while the indicator lights DS1, DS5 which are associated with pin 4 will be extinguished.

On both switches S1, S2, electrical contact pin 5 of wafer B is connected to ground. Electrical contact pin 3 of wafer 5 is respectively connected to one side of indicator lights DS3, DS7, and to test point jack TP44A, TP48. The switching segment of wafer B of switches S1, S2 is arranged to illuminate the indicator lights only in half of the switch positions. However, this on-off illumination of the indicator lights occurs in an alternating manner through switch positions 1 through 15. It should be noted that when the indicator lights are illuminated, the test point jack that is associated with the indicator light is at a ground potential. When the indicator light is extinguished, the test point jack at the potential level that is applied to the indicator light, in the present example, a positive 12 volts D.C.

On wafer C of both switches S1, S2, the electrical contact pin 5 is connected to ground. Electrical contact pin 3 of wafer C is respectively connected to one side of indicator lights DS4, DS8 and to test point jack TP45A, TP49. The switching segment of waver C of switches S1, S2 is arranged to illuminate the indicator light only in half of the switch positions. Thus, it should be noted that in switch position 1 through eight, the indicator lights DS4, DS8 will be illuminated and in switch position 9 through 15 the indicator lights DS4, DS8 will be extinguished. Again, it should be noted that when the indicator lights are illuminated, the test point jack that is associated with the indicator light is at a ground potential. When the indicator light is extinguished the test point jack at the potential pins indicated in the present example, a positive 12 volts DC.

Turning now to FIG. 2d, there is a schematic diagram of the circuit configuration that is controlled by switch S3. Switch S3 is a multi-position, three wafer rotary switch. On wafer A of switch S3, electrical contact pin 3 is connected directly to ground. Electrical contact pins 2 and 5 of wafer A are connected respectively to test point jacks TP39A, TP40A and one side of indicator lights DS10, DS11. The other side of indicator lights DS10, DS11 is connected to a positive 5 volt DC supply source. On wafer B of switch S3, only two electrical contact pins 1 and 3 are utilized. Electrical contact pin 3 of wafer B of switch S3 is connected directly to ground. Electrical contact pin 1 of wafer B of switch S3 is connected respectively to test point jack TP41A and one side indicated light DS12. The other side of indicator light DS12 is connected directly to a positive 5 volt DC supply source. On wafer C of switch S3, electrical contact pins 1 and 3 are connected directly to each other and to ground. Electrical contact pin 2 of wafer C is connected respectively to test point Jack TP38A and to one side of indicator light DS9. The other side of indicator light DS9 is connected directly to a positive 5 volt DC supply source. In the circuit arrangement of switch S3, when any or all of the indicator lights DS9 through DS12 are illuminated, the related test point jacks TP38A through TP41A will be at a ground potential. When switch S3 is operated such that any or all of the indicator lights DS9 through DS12 are extinguished, the test point jacks TP38A through TP41A which is respectively associated with a given indicator light, will be at a ground potential. Thus, it may be noted that the present test box apparatus is capable of a variety voltage signal and ground potential circuit combinations.

The test box apparatus may be utilized to test milti-missile adapter and missile simulator adapter units and circuit cards associated therewith, by simulating those signals which are applied from the manual control panel and remote control unit, and thereby be used for in shop troubleshooting. In order to apply the signals to a circuit card that requires testing, it is required to use a schematic diagram of that circuit card assembly to find which signals are needed to make that circuit card function. Then, a jumper wire is used from the appropriate switch test point to the test point of the circuit card (TP-1 thru TP-45). On switches S1 and S2 when indicater lights DS1 thru DS8 are illuminated, the corresponding test point is equal to ground. When they are not illuminated, the corresponding test points are equal to +12 VDC. When switch S3 is used, the switch S3 may be turned until indicator lights DS9 thru DS12 are at the voltage level required. When indicator lights DS9 thru DS12 are illuminated the corresponding test points are equal to ground and when indicator lights DS9 through DS12 are not illuminated, the corresponding test points are equal to 5 VDC. By changing the position of the switches S1, S2, S3, the user is able to manually change the voltage level at the corresponding test points. Switch S4 is designed to apply a 5 VDC signal from test point jack TP-37A when switch S4 is not pressed, then when switch S4 is pressed and held down indicator light DS14 will illuminate and test point jack TP-37A will equal ground; switch S4 also apply 12 VDC at test point jack TP-36A when switch S4 is not pressed. When switch S4 is pressed and held down test point jack TP36A will be connected to a ground potential.

This test box apparatus also has the function of a circuit card breakout box. The user may remove a circuit card from the unit under test and test it in the shop. Any circuit card up to a 45 pin card can be placed into connector A1. Then, by using any desired frequency or voltage apply it to the desired test point which corresponds to the circuit card assembly pin number, to simulate the function of the circuit card assembly under test. Then the user may check voltage levels and frequencies to determine the condition of that circuit card assembly. The test box apparatus may also be used to verify multi-pin relays and integrated circuit logic functions.

Although the invention has been described with reference to a particular embodiment, it will be understood to those skilled in the art that the invention is capable of a variety of alternative embodiments within the spirit and scope of the appended claims.

What is claimed is:

1. A test box apparatus for testing adapter boxes and circuit card assemblies comprising in combination:
   a container means,
   a plurality of test point jacks mounted on said container means, said plurality of test point jacks being arranged into a plurality of test point jack groups, said plurality of test point jack groups comprising a first test point jack group, a second test point jack group, a third test point jack group, and a fourth test point jack group,
   a connector plug mounted on said container means, said connector plug including a plurality of electrical contact pins, said plurality of electrical contact pins respectively connected directly to said first test point jack group, said second test point jack group being divided into sub-groups comprising respectively a first sub-group, a second sub-group, and a third sub-group, said first sub-group connected directly to ground, said second sub-group connected directly to a first predetermined voltage source, said third sub-group connected directly to a second predetermined voltage source, said third test point jack group comprising a fourth fifth and sixth sub-group which are respectively switchably connected between a third predetermined voltage source and ground, said fourth test point jack group switchably connected between a fourth predetermined voltage and ground, any test point jack of said plurality of test point jacks in said first, second, third and fourth groups being connectable to any other test point jack thereof by means of a jumper cable,
   a first, second and third switching means respectively connected to said fourth, fifth and sixth sub-group to respectively switch the test point jacks of said fourth, fifth and sixth sub-group between said third predetermined voltage source and ground, and,
   a fourth switching means connected to said fourth test point jack group, said fourth switching means switching said fourth test point jack group between said fourth predetermined voltage and ground.

2. A test box apparatus as described in claim 1 wherein said first predetermined voltage source comprises a positive 12 volt DC supply source.

3. A test box apparatus as described in claim 1 wherein said second predetermined voltage source comprises a positive 5 volt DC supply source.

4. A test box apparatus as described in claim 1 wherein said third predetermined voltage comprises a positive signal between 12 volts DC and ground.

5. A test box apparatus as described in claim 1 wherein said fourth predetermined voltage comprises a positive signal between 5 volts DC and ground.

6. A test box apparatus as described in claim 1 wherein said connector plug comprises a printed circuit card connector.

7. A test box apparatus as described in claim 1 wherein said connector plug comprises a cable connector.

8. A test box apparatus as described in claim 1 wherein said plurality of electrical contact pins comprise forty-five electrical contact pins.

* * * * *